United States Patent
Taniguchi et al.

(10) Patent No.: US 9,559,291 B2
(45) Date of Patent: Jan. 31, 2017

(54) ACOUSTIC WAVE DEVICE AND METHOD OF FABRICATING THE SAME

(71) Applicant: TAIYO YUDEN CO., LTD., Tokyo (JP)

(72) Inventors: Shinji Taniguchi, Tokyo (JP); Tokihiro Nishihara, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 315 days.

(21) Appl. No.: 14/068,485

(22) Filed: Oct. 31, 2013

(65) Prior Publication Data

US 2014/0132116 A1    May 15, 2014

(30) Foreign Application Priority Data

Nov. 15, 2012    (JP) ................................. 2012-250813

(51) Int. Cl.
*H01L 41/047* (2006.01)
*H01L 41/09* (2006.01)
(Continued)

(52) U.S. Cl.
CPC .......... *H01L 41/29* (2013.01); *H03H 9/02102* (2013.01); *H03H 9/02133* (2013.01); *H03H 9/173* (2013.01); *H03H 2003/021* (2013.01); *H03H 2003/0428* (2013.01); *H03H 2003/0442* (2013.01); *Y10T 29/42* (2015.01)

(58) Field of Classification Search
USPC ............................ 310/311–371; 333/186–193
See application file for complete search history.

(56) References Cited

U.S. PATENT DOCUMENTS

| 4,456,850 A | 6/1984 | Inoue et al. |
| 6,420,820 B1 | 7/2002 | Larson, III |

(Continued)

FOREIGN PATENT DOCUMENTS

| CN | 1333596 A | 1/2002 |
| JP | 58-137317 A | 8/1983 |

(Continued)

OTHER PUBLICATIONS

Chinese Office Action dated Dec. 21, 2015, in a Chinese patent application No. 201310566328.5.

(Continued)

*Primary Examiner* — Thomas Dougherty
(74) *Attorney, Agent, or Firm* — Chen Yoshimura LLP

(57) ABSTRACT

An acoustic wave device includes: a substrate; a piezoelectric film located on the substrate; a lower electrode and an upper electrode facing each other across the piezoelectric film, at least one of the lower electrode and the upper electrode including a first conductive film and a second conductive film formed on the first conductive film; an insulating film sandwiched between the first conductive film and the second conductive film and having a temperature coefficient of an elastic constant opposite in sign to a temperature coefficient of an elastic constant of the piezoelectric film; and a third conductive film formed on edge surfaces of the insulating film and the second conductive film and causing electrical short circuits between the first conductive film and the second conductive film.

10 Claims, 15 Drawing Sheets

(51) Int. Cl.
*H03H 9/15* (2006.01)
*H01L 41/29* (2013.01)
*H03H 9/02* (2006.01)
*H03H 9/17* (2006.01)
*H03H 3/02* (2006.01)
*H03H 3/04* (2006.01)

(56) References Cited

U.S. PATENT DOCUMENTS

| | | |
|---|---|---|
| 2002/0000898 A1 | 1/2002 | Takamine |
| 2002/0038989 A1 | 4/2002 | Larson, III |
| 2004/0145431 A1 | 7/2004 | Nakao et al. |
| 2006/0071736 A1 | 4/2006 | Ruby et al. |
| 2006/0103492 A1 | 5/2006 | Feng et al. |
| 2007/0132338 A1 | 6/2007 | Nakao et al. |
| 2011/0227671 A1* | 9/2011 | Zhang .................. H04R 17/00 333/195 |
| 2011/0241800 A1* | 10/2011 | Yokoyama ............... H03H 3/04 333/188 |
| 2011/0266925 A1 | 11/2011 | Ruby et al. |
| 2016/0142038 A1* | 5/2016 | Taniguchi .............. H03H 9/706 333/133 |

FOREIGN PATENT DOCUMENTS

| | | |
|---|---|---|
| JP | 60-16010 A | 1/1985 |
| JP | 2002-176334 A | 6/2002 |
| JP | 2004-254291 A | 9/2004 |
| JP | 2006-109472 A | 4/2006 |

OTHER PUBLICATIONS

Japanese Office Action dated Jun. 28, 2016, in a counterpart Japanese patent application No. 2012-250813.
Chinese Office Action dated Sep. 1, 2016, in a counterpart Chinese patent application No. 201310566328.5. (Partial translation of the Office Action is attached as a concise explanation of relevance.).

* cited by examiner

ACOUSTIC WAVE DEVICE AND METHOD OF FABRICATING THE SAME

CROSS-REFERENCE TO RELATED APPLICATION

This application is based upon and claims the benefit of priority of the prior Japanese Patent Application No. 2012-250813, filed on Nov. 15, 2012, the entire contents of which are incorporated herein by reference.

FIELD

A certain aspect of the present invention relates to an acoustic wave device and a method of fabricating the same.

BACKGROUND

Acoustic wave devices using a piezoelectric thin film resonator are used as filters of wireless devices, for example. The piezoelectric thin film resonator has a structure designed to have a lower electrode and an upper electrode facing each other across a piezoelectric film. A region where the lower electrode and the upper electrode face each other across the piezoelectric film is a resonance region. Examples of the acoustic wave devices using the piezoelectric thin film resonator include a filter and a duplexer. The piezoelectric film, the lower electrode, and the upper electrode of the piezoelectric thin film resonator usually have negative temperature coefficients of an elastic constant. Thus, the resonance frequency of the piezoelectric thin film resonator shifts to a low frequency side as temperature increases. As described above, in the acoustic wave device, the resonance frequency, the anti-resonance frequency, and the passband change in accordance with temperature.

There has been known a piezoelectric thin film resonator that uses an insulating film such as a silicon oxide film having a temperature coefficient opposite to those of the piezoelectric film, the lower electrode, and the upper electrode as a temperature compensation film to prevent the frequency from changing in accordance with the temperature (e.g. Japanese Patent Application Publication Nos. 58-137317 (Patent Document 1) and 60-16010 (Patent Document 2)).

There has been known a piezoelectric thin film resonator that provides conductive films on the upper and lower surfaces of the insulating film to cause short circuits or a piezoelectric thin film resonator that embeds a temperature compensation film in the lower electrode or the upper electrode to prevent the decrease of an electromechanical coupling coefficient due to the use of the temperature compensation film (Japanese Patent Application Publication No. 60-16010 (Patent Document 2), U.S. Patent Application Publication No. 2011/0266925 (Patent Document 3), and U.S. Pat. No. 6,420,820 (Patent Document 4)).

It has been known that resonance characteristics degrade when the upper electrode is thinner in the peripheral portion of the resonance region than in the center portion (e.g. FIG. 8 in Japanese Patent Application Publication No. 2006-109472 (Patent Document 5)).

When the temperature compensation film is embedded in the lower electrode or the upper electrode as disclosed in Patent Documents 3 and 4, the lower electrode or the upper electrode becomes thinner in the peripheral portion of the resonance region than in the center portion. Thus, resonance characteristics degrade as disclosed in FIG. 8 of Patent Document 5.

SUMMARY OF THE INVENTION

According to an aspect of the present invention, there is provided an acoustic wave device including: a substrate; a piezoelectric film located on the substrate; a lower electrode and an upper electrode facing each other across the piezoelectric film, at least one of the lower electrode and the upper electrode including a first conductive film and a second conductive film formed on the first conductive film; an insulating film sandwiched between the first conductive film and the second conductive film and having a temperature coefficient of an elastic constant opposite in sign to a temperature coefficient of an elastic constant of the piezoelectric film; and a third conductive film formed on edge surfaces of the insulating film and the second conductive film and causing electrical short circuits between the first conductive film and the second conductive film.

According to an aspect of the present invention, there is provided a method of fabricating an acoustic wave device, the method including: forming a piezoelectric film on a substrate; and forming a lower electrode and an upper electrode, on the substrate, facing each other across the piezoelectric film, wherein at least one of the forming of the lower electrode and the forming of the upper electrode includes: forming a first conductive film; forming an insulating film, on the first conductive film, having a temperature coefficient of an elastic constant opposite in sign to a temperature coefficient of an elastic constant of the piezoelectric film; forming a second conductive film on the insulating film; and etching the second conductive film, the insulating film, and the first conductive film so that a third conductive film is formed on edge surfaces of the insulating film and the second conductive film.

DETAILED DESCRIPTION

Hereinafter, a description will be given of embodiments of the present invention with reference to the drawings.

First Embodiment

Figure 1A:
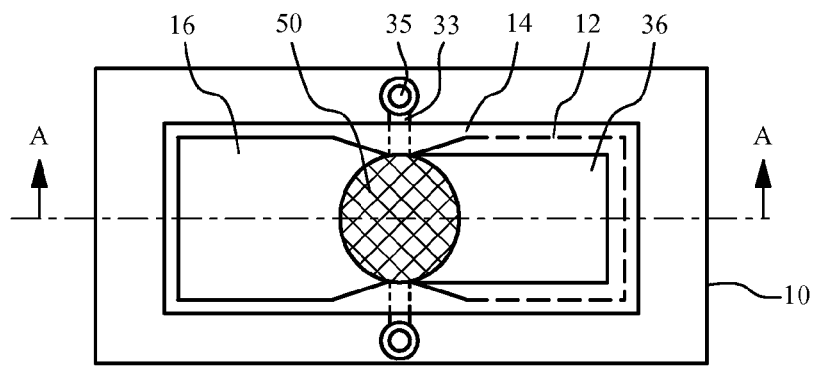
FIG. 1A is a plan view of a piezoelectric thin film resonator in accordance with a first embodiment.
Figure 1B:
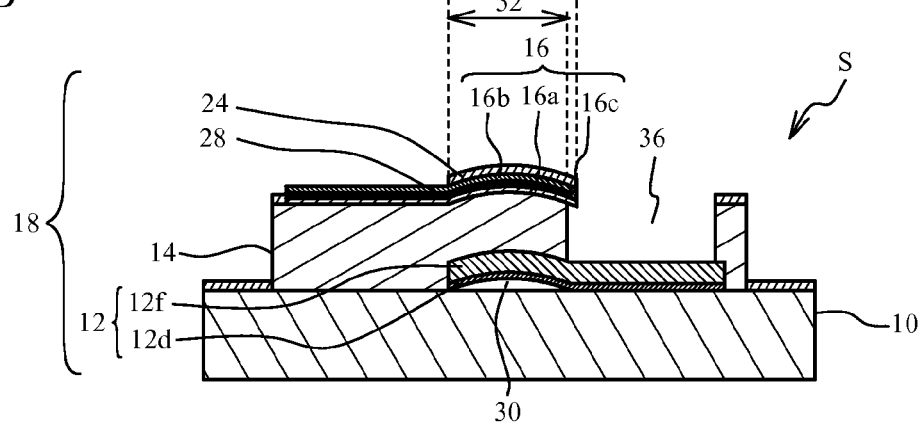
FIG. 1B and FIG. 1C are cross-sectional views taken along line A-A in FIG. 1A.
Figure 1C:
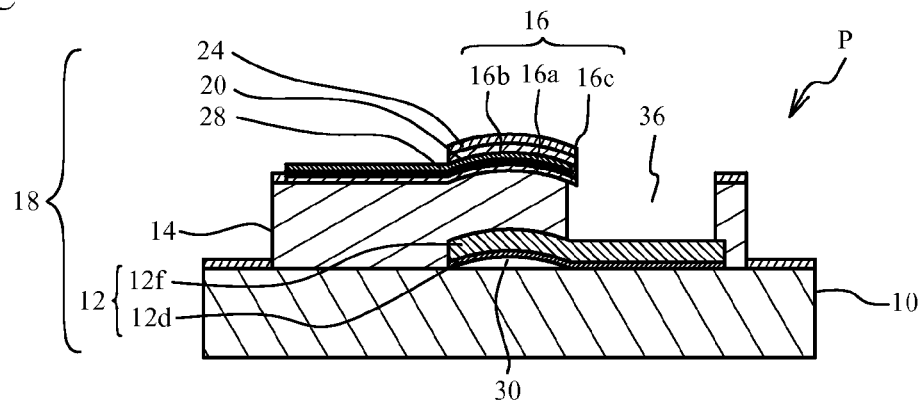

A first embodiment is an exemplary resonator used in an acoustic wave device. FIG. 1A is a plan view of a piezoelectric thin film resonator in accordance with the first embodiment, and FIG. 1B and FIG. 1C are cross-sectional views taken along line A-A in FIG. 1A. FIG. 1B is a cross-sectional view of a series resonator of, for example, a ladder-type filter, and FIG. 1C is a cross-sectional view of a parallel resonator of, for example, a ladder-type filter.

With reference to FIG. 1A and FIG. 1B, a description will be given of a structure of a series resonator S. A lower electrode 12 is located on a substrate 10 that is a silicon (Si) substrate so that a dome-shaped air-space 30 bulging out toward the lower electrode 12 side is formed between the lower electrode 12 and the flat principal surface of the substrate 10. The dome-shaped bulge is a bulge having a shape where the height of the air-space 30 is low near the periphery of the air-space 30 and the height of the air-space 30 increases at closer distances to the center. The lower electrode 12 includes a conductive film 12d and a conductive film 12f. The conductive film 12d is, for example, a Cr (chrome) film, and the conductive film 12f is, for example, a Ru (ruthenium) film.

On the lower electrode 12, provided is a piezoelectric film 14 primarily composed of aluminum nitride (AlN) having a (002) direction as a main axis. An upper electrode 16 is located on the piezoelectric film 14 so as to have a region (resonance region 50) facing the lower electrode 12. The resonance region 50 has an elliptical shape, and is a region where an acoustic wave in a thickness longitudinal oscillation mode resonates. In addition, a region where the lower electrode 12 and the upper electrode 16 face each other across the piezoelectric film 14 is an opposing region 52. The lower electrode 12 and the upper electrode 16 face each other across at least a part of the piezoelectric film 14. As illustrated in FIG. 1A through FIG. 1C, the lower electrode 12 and the upper electrode 16 may face each other across a part of the piezoelectric film 14. The upper electrode 16 includes a lower layer 16a and an upper layer 16b. The lower layer 16a and the upper layer 16b are, for example, Ru films. An insulating film 28 is located between the lower layer 16a and the upper layer 16b. The insulating film 28 is a film primarily composed of silicon oxide. Silicon oxide has a positive temperature coefficient of an elastic constant. A conductive film 16c is formed on edge surfaces of the insulating film 28 and the upper layer 16b.

A silicon oxide film is formed on the upper electrode 16 as a frequency adjusting film 24. A multilayered film 18 in the resonance region 50 includes the lower electrode 12, the piezoelectric film 14, the upper electrode 16, the insulating film 28, and the frequency adjusting film 24. The frequency adjusting film 24 may function as a passivation film.

As illustrated in FIG. 1A, an introduction path 33 to etch a sacrifice layer is formed in the lower electrode 12. The sacrifice layer is a layer to form the air-space 30. The piezoelectric film 14 does not cover the vicinity of the tip of the introduction path 33, and the lower electrode 12 has a hole portion 35 at the tip of the introduction path 33. As illustrated in FIG. 1A and FIG. 1B, an aperture 36 to provide electrical connection with the lower electrode 12 is formed in the piezoelectric film 14. An underlying film for bumps such as Au for external connection may be located on an extracting wiring of the lower electrode 12 at the bottom of the aperture 36 and/or an extracting wiring of the upper electrode 16.

With reference to FIG. 1A and FIG. 1C, a description will be given of a structure of a parallel resonator P. The parallel resonator P includes a mass load film 20 made of a Ti (titanium) layer between the upper electrode 16 and the frequency adjusting film 24 as compared to the series resonator S. Thus, the multilayered film 18 includes the mass load film 20 formed across the entire surface in the resonance region 50 in addition to the multilayered film of the series resonator S. Other structures are the same as those of the series resonator S illustrated in FIG. 1B, and thus a description thereof is omitted.

The difference between resonance frequencies of the series resonator S and the parallel resonator P is adjusted by the film thickness of the mass load film 20. The resonance frequencies of both the series resonator S and the parallel resonator P are adjusted by adjusting the film thickness of the frequency adjusting film 24.

In FIG. 1B and FIG. 1C, an outer periphery of the piezoelectric film 14 at the aperture 36 side is located further in than the upper electrode 16. This prevents the acoustic wave in the piezoelectric film 14 from leaking to the outside of the resonance region 50. In addition, the position of the outer periphery of the piezoelectric film 14 may coincide with that of the upper electrode 16 or further out than that of the upper electrode 16.

A quartz substrate, a glass substrate, a ceramic substrate, or a GaAs substrate may be used as the substrate 10 instead of a Si substrate. A single layer film such as Al (aluminum), Ti (titanium), Cu (copper), Mo (molybdenum), W (tungsten), Ta (tantalum), Pt (platinum), Rh (rhodium) or Ir (iridium) or a multilayered film of them may be used as the lower electrode 12 and the upper electrode 16 instead of Ru and Cr. When the upper electrode 16 is a multilayered film, the insulating film 28 may be located in a boundary face of the multilayered film, and the lower layer 16a of the upper electrode 16 may be Ru while the upper layer 16b may be Mo. The piezoelectric film 14 may use ZnO (zinc oxide), PZT (lead zirconate titanate), or PbTiO$_3$ (lead titanate)

instead of aluminum nitride. Or, the piezoelectric film 14 may be primarily composed of aluminum nitride, and include other elements to improve resonance characteristics or piezoelectricity. For example, the use of Sc (scandium) as an additive element improves piezoelectricity of the piezoelectric film 14, and the effective electromechanical coupling coefficient of the piezoelectric thin film resonator can be therefore improved.

The insulating film 28 has a temperature coefficient of an elastic constant opposite in sign to the temperature coefficient of the elastic constant of the piezoelectric film 14. Thus, the temperature coefficient of frequency can be made to be close to 0. When the piezoelectric film 14 is aluminum nitride, the temperature coefficient of the elastic constant is negative. Thus, a material having a positive temperature coefficient of an elastic constant is used as the insulating film 28. For example, a silicon oxide film or a silicon nitride film has a positive temperature coefficient of an elastic constant. The silicon oxide film or the silicon nitride film may fail to have a stoichiometric composition. In addition, the insulating film 28 may be primarily composed of a silicon oxide film or a silicon nitride film, and include other elements to improve resonance characteristics or temperature characteristics. For example, the insulating film 28 may be primarily composed of a silicon oxide film, and include any of F (fluorine), H (hydrogen), $CH_3$, $CH_2$, Cl (chlorine), C (carbon), N (nitrogen), P (phosphorus), and S (sulfur). This enables to make the temperature coefficient of the elastic constant of the silicon oxide film high. Thus, the film thickness of the insulating film 28 can be reduced. Therefore, the patterning accuracy of the insulating film 28 is improved. In addition, when the piezoelectric film 14 is formed on the insulating film 28 as described in a second embodiment, the deterioration of the orientation of the piezoelectric film 14 can be reduced because the insulating film 28 is thin.

A silicon nitride film or aluminum nitride may be used as the frequency adjusting film 24 instead of a silicon oxide film. A single layer film such as Ru, Cr, Al, Cu, Mo, W, Ta, Pt, Rh, or Ir may be used as the mass load film 20. In addition, an insulating film made of metal nitride such as silicon nitride or metal oxide such as silicon oxide may be used. The mass load film 20 may be formed under the lower electrode 12, between layers of the lower electrode 12, on the upper electrode 16, between the lower electrode 12 and the piezoelectric film 14, or between the piezoelectric film 14 and the upper electrode 16 besides between layers of the upper electrode 16. The mass load film 20 may be larger than the resonance region 50 as long as it is formed so as to include the resonance region 50. Adhesion strengths of the frequency adjusting films 24 in the resonators can be made to be equal to each other by providing adhesion layers on the upper layer 16b in the series resonator and on the mass load film 20 in the parallel resonator as the base for the frequency adjusting film 24.

Figure 2A:
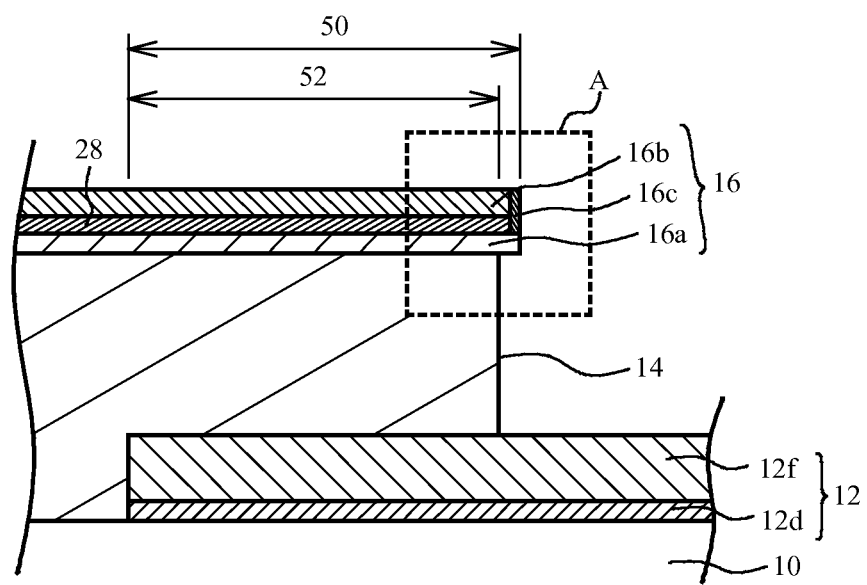
FIG. 2A is a schematic cross-sectional view of a lower electrode and an upper electrode in a resonance region.
Figure 2B:
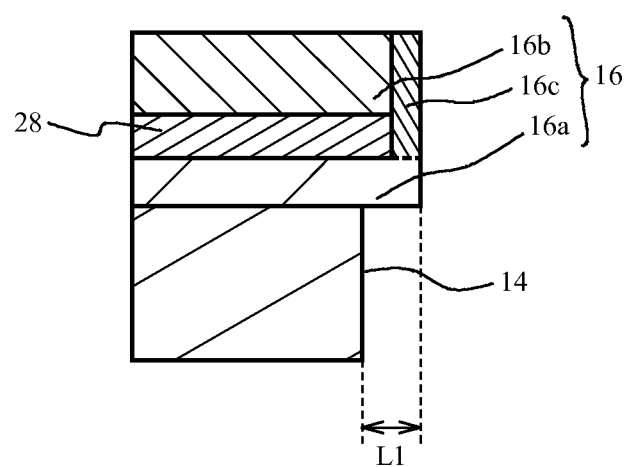
FIG. 2B is an enlarged view of a region A in FIG. 2A.

A description will be given of the upper electrode 16 and the insulating film 28. FIG. 2A is a schematic cross-sectional view of the lower electrode and the upper electrode in the resonance region, and FIG. 2B is an enlarged view of a region A in FIG. 2A. As illustrated in FIG. 2A and FIG. 2B, the conductive film 16c is formed on edge surfaces of the insulating film 28 and the upper layer 16b. The conductive film 16c causes electrical short circuits between the lower layer 16a and the upper layer 16b.

FIG. 3A through FIG. 4D are schematic cross-sectional views illustrating a method of fabricating the piezoelectric thin film resonator of the first embodiment. To fabricate the piezoelectric thin film resonator illustrated in FIG. 1A through FIG. 1C, the air-space is formed by using a sacrifice layer. However, the following description will describe the method of forming the lower electrode, the piezoelectric film, and the upper electrode, and omit the explanation for others.

Figure 3A:
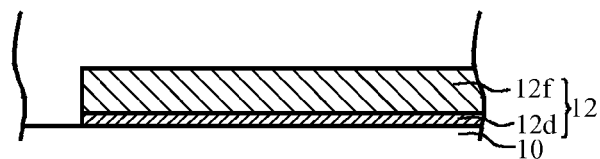
FIG. 3A through FIG. 3E are schematic cross-sectional views illustrating a method of fabricating the piezoelectric thin film resonator of the first embodiment (No. 1)

As illustrated in FIG. 3A, the conductive film 12d and the conductive film 12f are formed on the substrate 10 as the lower electrode 12. The lower electrode 12 is formed by, for example, sputtering, vacuum evaporation, or CVD (Chemical Vapor Deposition). Then, the lower electrode 12 is patterned into a desired shape by photolithography and etching. The lower electrode 12 may be formed by liftoff.

Figure 3B:
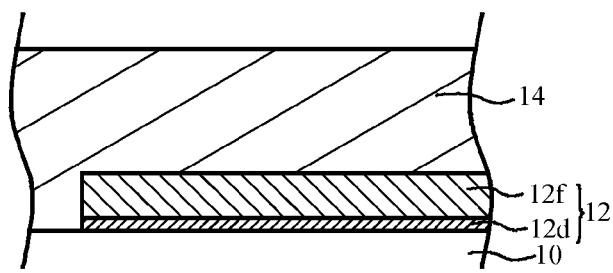
Figure 3C:
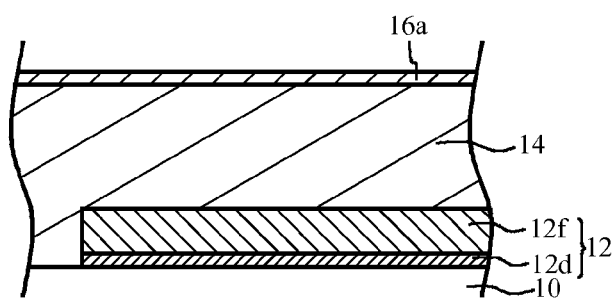
Figure 3D:
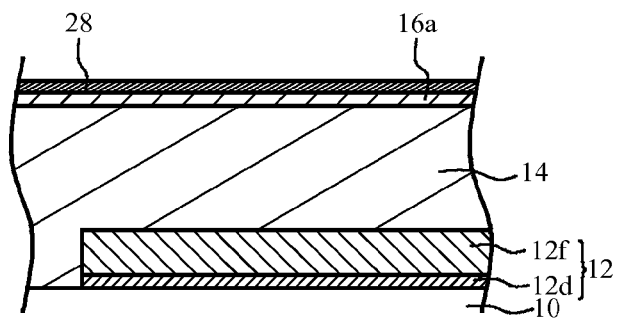
Figure 3E:
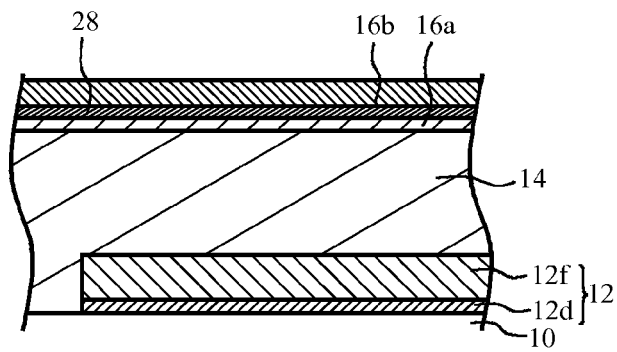

As illustrated in FIG. 3B, the piezoelectric film 14 is formed on the lower electrode 12 and the substrate 10. As illustrated in FIG. 3C, the lower layer 16a is formed on the piezoelectric film 14. As illustrated in FIG. 3D, the insulating film 28 is formed on the lower layer 16a. As illustrated in FIG. 3E, the upper layer 16b is formed on the insulating film 28. The piezoelectric film 14, the lower layer 16a, the insulating film 28, and the upper layer 16b are formed by, for example, sputtering, vacuum evaporation, or CVD.

Figure 4A:
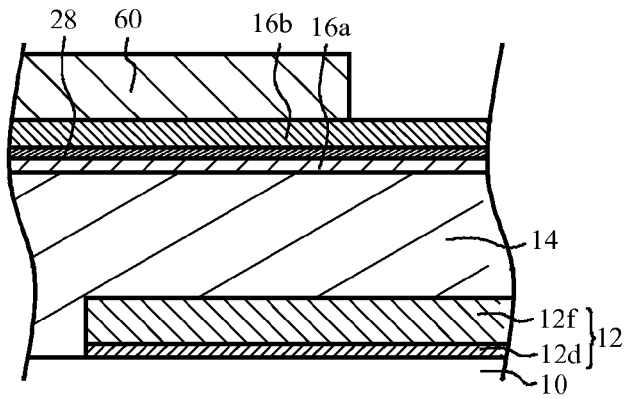
FIG. 4A through FIG. 4D are schematic cross-sectional views illustrating the method of fabricating the piezoelectric thin film resonator of the first embodiment (No. 2)
Figure 4B:
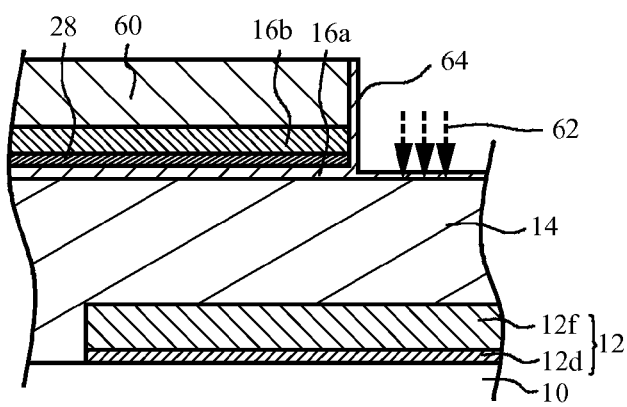

As illustrated in FIG. 4A, a photoresist 60 is formed on the upper layer 16b. The photoresist 60 has a pattern of the upper electrode 16. As illustrated in FIG. 4B, the upper layer 16b, the insulating film 28, and the lower layer 16a are etched by physical etching. The physical etching enables to etch materials according to the pattern of the photoresist 60 even when the materials to be etched are different. For example, the upper layer 16b, the insulating film 28, and the lower layer 16a are etched by irradiating them with an Ar (argon) ion 62 as sputter etching or ion milling. In the physical etching, a material 64 of an etching substance that was etched adheres to a side surface of the exposed etching substance. When the lower layer 16a is etched, the material 64 including a material of the lower layer 16a adheres to the edge surfaces of the upper layer 16b and the insulating film 28.

Figure 4C:
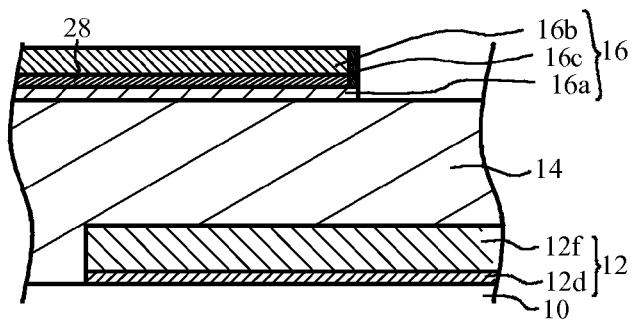
Figure 4D:
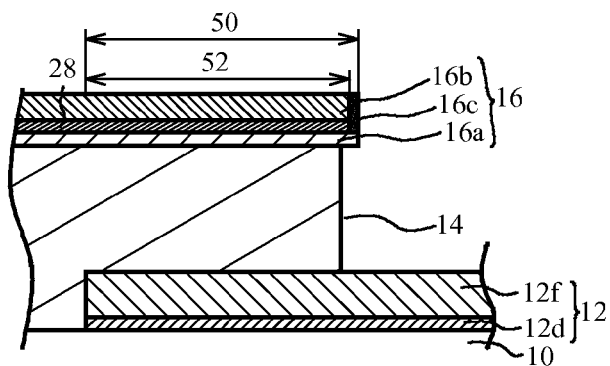

As illustrated in FIG. 4C, the photoresist 60 is removed after the upper layer 16b, the insulating film 28, and the lower layer 16a are etched. The material 64 forms the conductive film 16c including the material of the lower layer 16a on the edge surfaces of the upper layer 16b and the insulating film 28. The upper layer 16b, the lower layer 16a, and the conductive film 16c form the upper electrode 16. As illustrated in FIG. 4D, the piezoelectric film 14 is etched by using a photoresist (not illustrated) or the upper electrode 16 as an etching mask. The piezoelectric film 14 may be etched by wet etching or dry etching. When the piezoelectric film 14 is AlN, the piezoelectric film 14 is etched by using solution including, for example, phosphoric acid. This process forms the resonance region 50 where the lower electrode 12 overlaps with the upper electrode 16.

As illustrated in FIG. 1A through FIG. 1C and FIG. 4D, the resonance region 50 at the extracting wiring side of the upper electrode 16 (left side in the drawings) is defined by the outer periphery of the lower electrode 12. The outer periphery of the resonance region 50 at the extracting wiring side of the lower electrode 12 (right side in the drawings) is defined by the outer periphery of the upper electrode 16. The outer periphery of the piezoelectric film 14 is formed further in than the outer periphery of the upper electrode 16 by distance L1 (see FIG. 2B), and thus the insulating film 28 includes the opposing region 52 where the lower electrode 12 and the upper electrode 16 face each other across the piezoelectric film 14 as viewed from the top.

Fabricated was the resonator in accordance with the first embodiment illustrated in FIG. 1A and FIG. 1B. Fabricated was a resonator in accordance with a first comparative example that does not form the insulating film 28 for comparison. The first comparative example has the same structure as that of the first embodiment except that the insulating film 28 is not formed. The following presents the material and the film thickness of each layer in the first embodiment. Frequency adjusting film 24: silicon oxide with a film thickness of approximately 40 nm Upper layer 16b of the upper electrode: Ru with a film thickness of approximately 200 nm Insulating film 28: silicon oxide with a film thickness of approximately 80 nm Lower layer 16a of the upper electrode: Ru with a film thickness of approximately 30 nm Piezoelectric film 14: AlN with a film thickness of approximately 1.16 μm Conductive film 12f of the lower electrode: Ru with a film thickness of approximately 140 nm Conductive film 12d of the lower electrode: Cr with a film thickness of approximately 80 nm The resonance region 50 where the upper electrode 16 and the lower electrode 12 face each other has an elliptical shape, a major axis of approximately 175 μm, and a minor axis of approximately 110 μm.

Figure 5A:
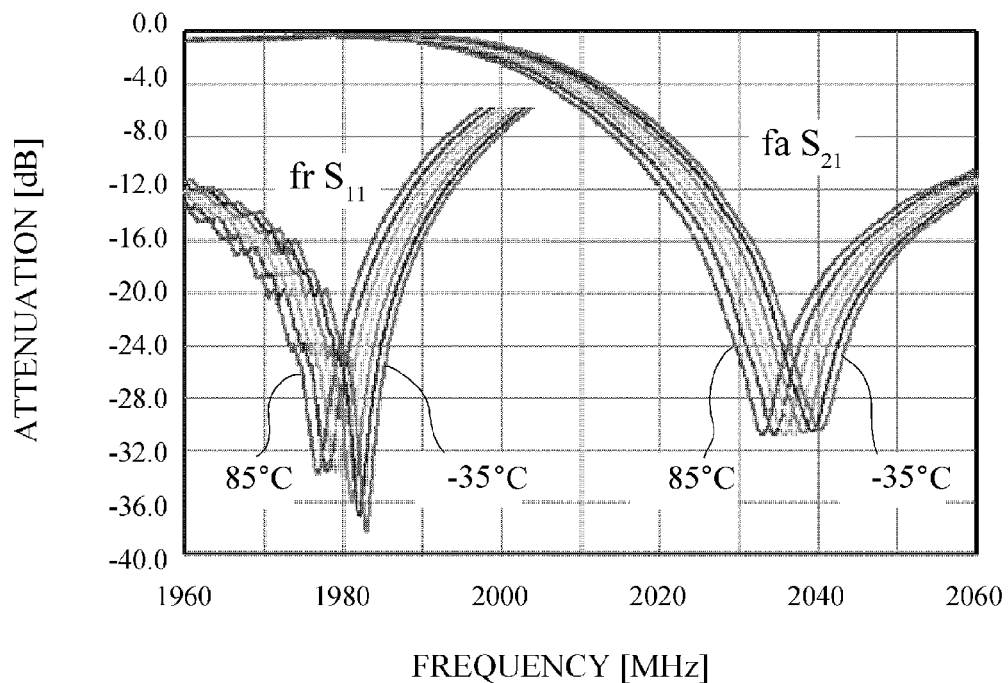
FIG. 5A and FIG. 5B are diagrams illustrating temperature dependencies of resonance frequencies and anti-resonance frequencies of a first comparative example and the first embodiment, respectively.
Figure 5B:
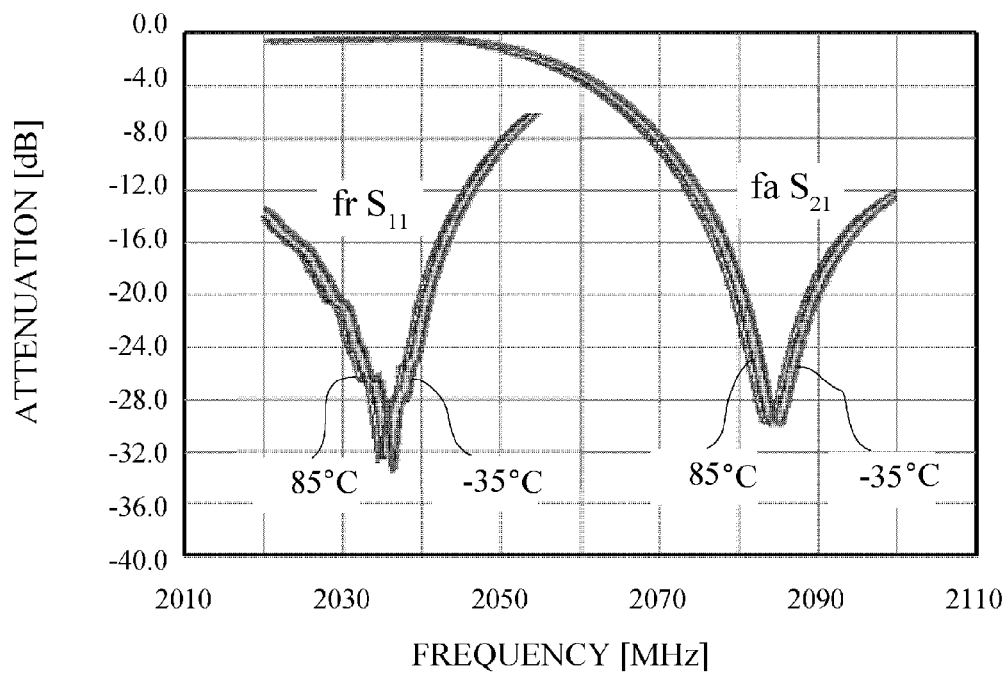

FIG. 5A and FIG. 5B are diagrams illustrating temperature dependencies of resonance frequencies and anti-resonance frequencies of the first comparative example and the first embodiment, respectively. The resonance frequency fr was obtained by measuring reflection characteristics S11 of the resonator. The anti-resonance frequency fa was obtained by measuring pass characteristics S21 of the resonator. FIG. 5A and FIG. 5B present results obtained by measuring S1 and S21 of the resonator at intervals of 20° C. from −35° C. to 85° C. According to FIG. 5A and FIG. 5B, temperature coefficients of resonance frequencies and anti-resonance frequencies of the first comparative example and the first embodiment are as follows.

First Comparative Example

Temperature coefficient of resonance frequency: −27.3 ppm/° C.
Temperature coefficient of anti-resonance frequency: −32.1 ppm/° C.

First Embodiment

Temperature coefficient of resonance frequency: −8.7 ppm/° C.
Temperature coefficient of anti-resonance frequency: −8.5 ppm/° C.

The temperature coefficient is improved by 20 ppm/° C. in the first embodiment compared to that of the first comparative example. The reason why the temperature coefficient of the frequency becomes small in the first embodiment as described above is because the temperature coefficient of the elastic constant of the piezoelectric film 14 is opposite in sign to that of the insulating film 28. As described above, sandwiching the insulating film 28 between the lower layer 16a and the upper layer 16b enables to reduce the temperature dependencies of the resonance frequency and the anti-resonance frequency.

In the first embodiment, the insulating film 28 has a temperature coefficient of an elastic constant opposite in sign to that of the piezoelectric film 14. This enables to reduce the temperature dependency of the frequency as illustrated in FIG. 5A and FIG. 5B. In addition, the insulating film 28 is formed between the lower layer 16a (first conductive film) and the upper layer 16b (second conductive film), and the conductive film 16c causes electrical short circuits between the lower layer 16a and the upper layer 16b. Thus, the capacitance of the insulating film 28 does not electrically contribute. Thus, the effective electromechanical coupling coefficient can be made to be high. In addition, the conductive film 16c causes electrical short circuits between the lower layer 16a and the upper layer 16b, and thus the upper electrode 16 does not become thinner in the peripheral portion of the resonance region 50 than in the center portion unlike Patent Documents 3 and 4. Thus, the degradation of the resonance characteristics as illustrated in FIG. 8 of Patent Document 5 can be reduced.

In addition, the film thickness of the conductive film 16c in the normal direction of the edge surfaces of the insulating film 28 and the upper layer 16b is less than the film thickness of the lower layer 16a in the normal direction of the substrate 10. This further reduces the deterioration of the resonance characteristics.

As illustrated in FIG. 1A through FIG. 1C, when the film thickness of the conductive film 16c or the distance L1 is assumed to be as an error, the insulating film 28 substantially includes the opposing region 52 as viewed from the top. That is to say, the area of the insulating film 28 is equal to or greater than that of the opposing region 52. As descried above, the lower layer 16a and the upper layer 16b are electrically interconnected outside the opposing region 52. This enables to further reduce the deterioration of the resonance characteristics. Further, the film thickness of the upper electrode 16 including the insulating film 28 continuously changes in the resonance region 50. Unlike Patent Documents 3 and 4, the thickness of the upper electrode 16 does not discontinuously change. This enables to further reduce the deterioration of the resonance characteristics.

Furthermore, as illustrated in FIG. 4C, the upper layer 16b, the insulating film 28, and the lower layer 16a are etched so that the conductive film 16c is formed on the edge surfaces of the insulating film 28 and the upper layer 16b. This simplifies the fabrication process to cause the electrical short circuits between the lower layer 16a and the upper layer 16b. Further, the film thickness of the conductive film 16c can be made to be thinner than that of the lower layer 16a. This enables to further reduce the deterioration of the resonance characteristics.

Second Embodiment

Figure 6A:
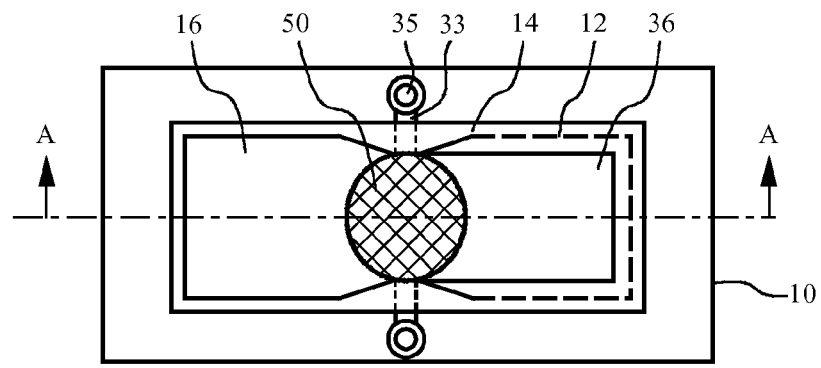
FIG. 6A is a plan view of a piezoelectric thin film resonator in accordance with a second embodiment.
Figure 6B:
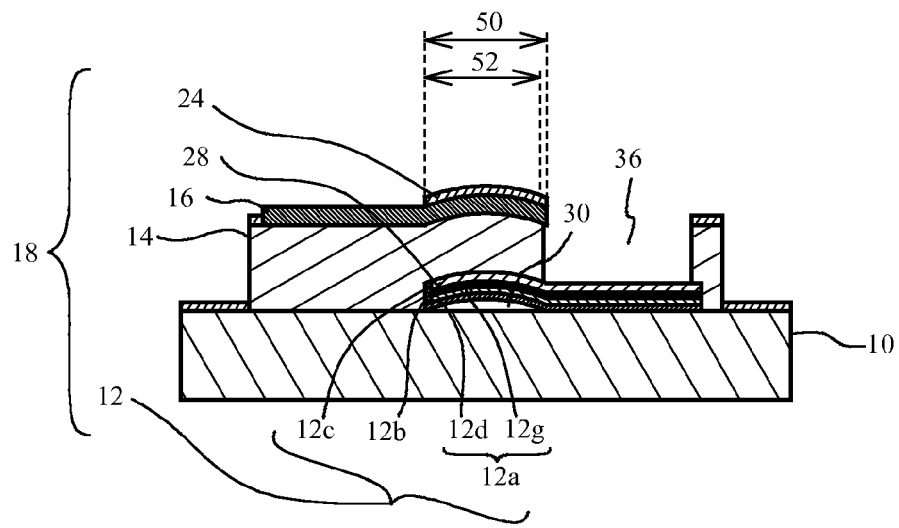
FIG. 6B and FIG. 6C are cross-sectional views taken along line A-A in FIG. 6A.
Figure 6C:
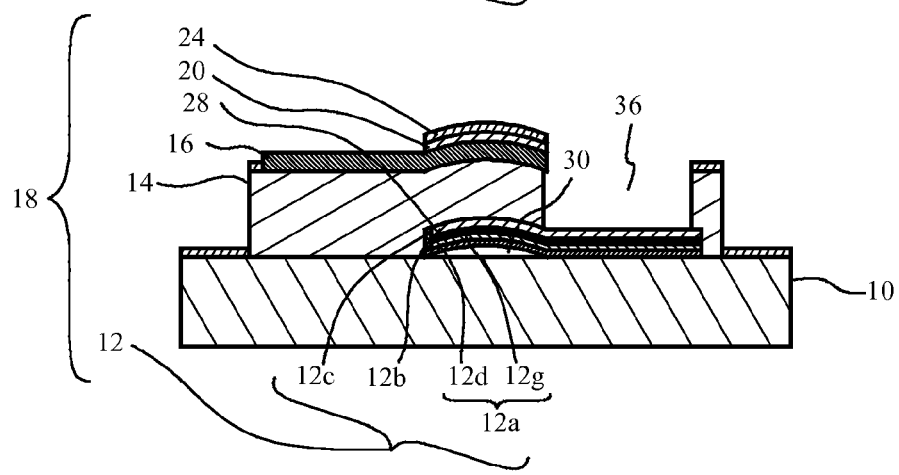

The second embodiment forms the insulating film in the lower electrode. FIG. 6A is a plan view of a piezoelectric thin film resonator in accordance with a second embodiment, and FIG. 6B and FIG. 6C are cross-sectional views taken along line A-A in FIG. 6A. FIG. 6B is a cross-sectional view of a series resonator of, for example, a ladder-type filter, and FIG. 6C is a cross-sectional view of a parallel resonator of, for example, a ladder-type filter.

As illustrated in FIG. 6B and FIG. 6C, the lower electrode 12 includes a lower layer 12a (first conductive film), an upper layer 12b (second conductive film), and a conductive film 12c (third conductive film). The lower layer 12a is formed on the substrate 10 through the air-space 30. The lower layer 12a includes the conductive film 12d and a conductive film 12g formed on the conductive film 12d. The conductive film 12d is, for example, a Cr film. The insulating film 28 is formed on the lower layer 12a. The upper layer 12b is formed on the insulating film 28. The conductive film 12g and the upper layer 12b are, for example, Ru films. The insulating film 28 is, for example, a silicon oxide film. The upper electrode 16 is a Ru film. Other structures are the same as those of the first embodiment illustrated in FIG. 1A through FIG. 1C, and thus a description thereof is omitted.

Figure 7A:
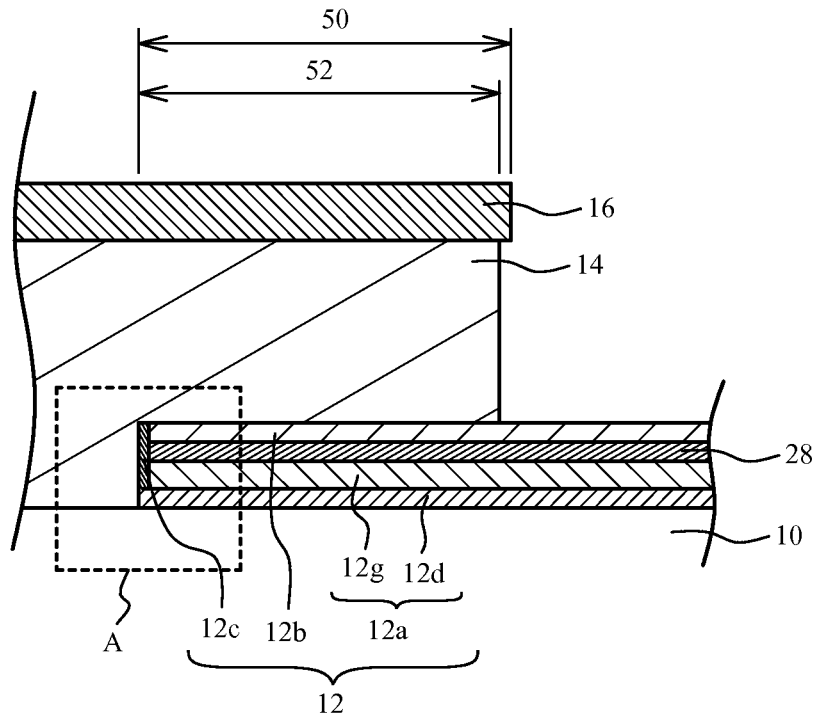
FIG. 7A is a schematic cross-sectional view of a lower electrode and an upper electrode in the resonance region.
Figure 7B:
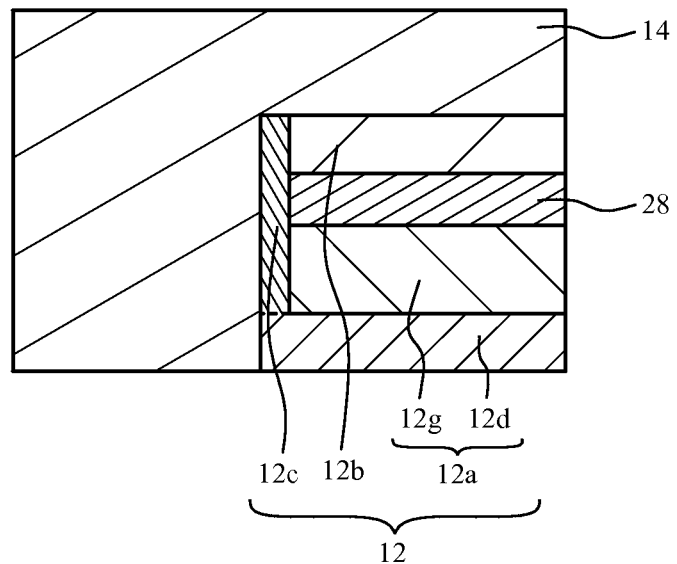
FIG. 7B is an enlarged view of the region A in FIG. 7A.

A description will be given of the lower electrode 12 and the insulating film 28. FIG. 7A is a schematic cross-sectional view of the lower electrode and the upper electrode in the resonance region, and FIG. 7B is an enlarged view of the region A in FIG. 7A. As illustrated in FIG. 7A and FIG. 7B, the conductive film 12c is formed on the edge surfaces of the insulating film 28 and the upper layer 12b. The conductive film 12c causes electrical short circuits between the lower layer 12a and the upper layer 12b.

FIG. 8A through FIG. 9D are schematic cross-sectional views illustrating a method of fabricating the piezoelectric thin film resonator of the second embodiment. To fabricate the piezoelectric thin film resonator illustrated in FIG. 6A through FIG. 6C, the air-space is formed by using a sacrifice layer. However, the following description describes a method of forming the lower electrode, the piezoelectric film, and the upper electrode, and omits the explanations for others.

Figure 8A:
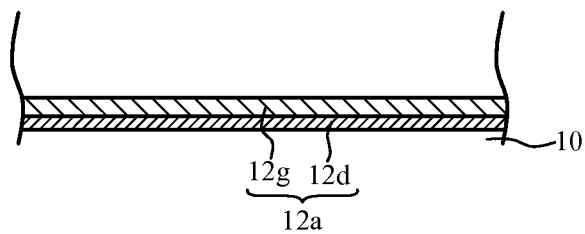
FIG. 8A through FIG. 8E are schematic cross-sectional views illustrating a method of fabricating the piezoelectric thin film resonator of the second embodiment (No. 1)
Figure 8B:
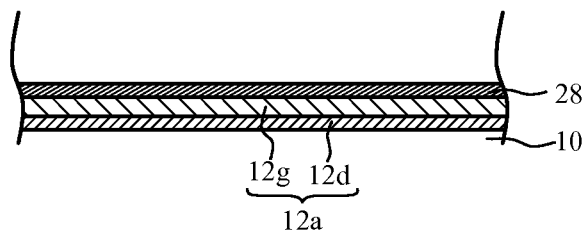
Figure 8C:
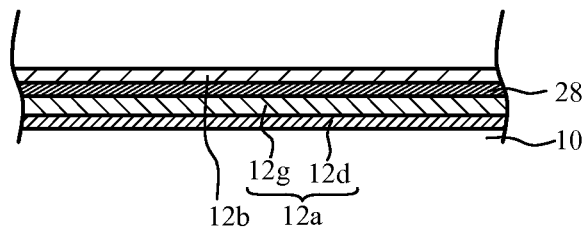

As illustrated in FIG. 8A, the conductive film 12d and the conductive film 12g are formed on the substrate 10. The lower layer 12a includes the conductive film 12d and the conductive film 12g. The conductive films 12d and 12g are formed by, for example, sputtering, vacuum evaporation, or CVD. As illustrated in FIG. 8B, the insulating film 28 is formed on the lower layer 12a. As illustrated in FIG. 8C, the upper layer 12b is formed on the insulating film 28. The insulating film 28 and the upper layer 12b are formed by, for example, sputtering, vacuum evaporation, or CVD.

Figure 8D:
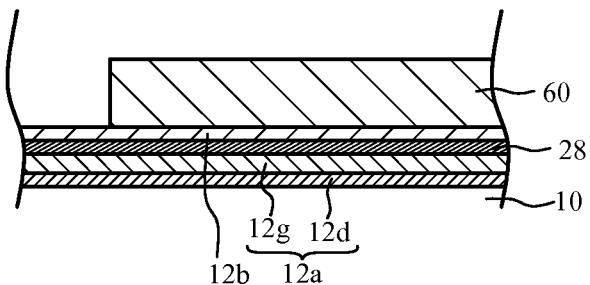
Figure 8E:
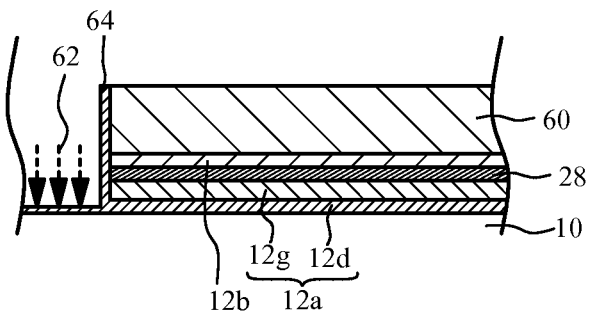

As illustrated in FIG. 8D, the photoresist 60 is formed on the upper layer 12b. The photoresist 60 has a pattern of the lower electrode 12. As illustrated in FIG. 8E, the upper layer 12b, the insulating film 28, and the lower layer 12a are etched by physical etching. The physical etching enables to etch materials according to the pattern of the photoresist 60 even when the materials to be etched are different. As described in FIG. 4B of the first embodiment, when the lower layer 12a is etched, the material 64 including a material of the lower layer 12a adheres to the edge surfaces of the upper layer 12b and the insulating film 28.

Figure 9A:
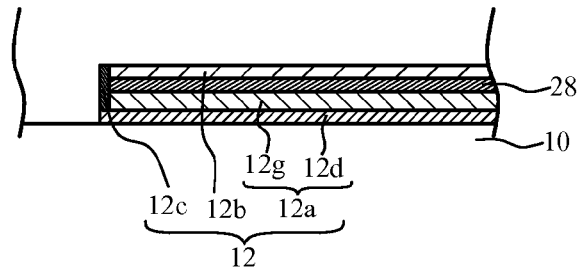
FIG. 9A through FIG. 9D are schematic cross-sectional views illustrating the method of fabricating the piezoelectric thin film resonator of the second embodiment (No. 2)
Figure 9B:
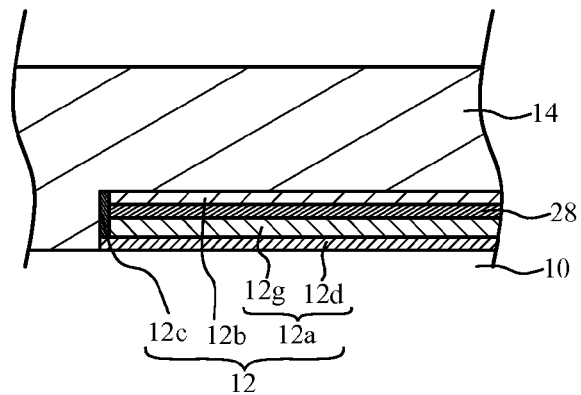

As illustrated in FIG. 9A, the photoresist 60 is removed after the upper layer 12b, the insulating film 28, and the lower layer 16a are etched. The material 64 forms the conductive film 12c including the material of the lower layer 12a on the edge surfaces of the upper layer 12b and the insulating film 28. The upper layer 12b, the lower layer 12a, and the conductive film 12c form the lower electrode 12. As illustrated in FIG. 9B, the piezoelectric film 14 is formed on the substrate 10 and the lower electrode 12. The piezoelectric film 14 is formed by, for example, sputtering, vacuum evaporation, or CVD.

Figure 9C:
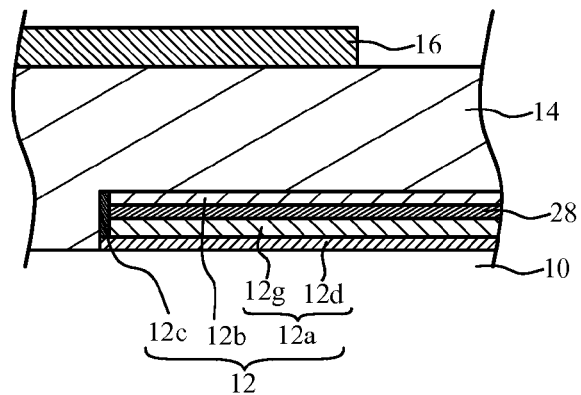
Figure 9D:
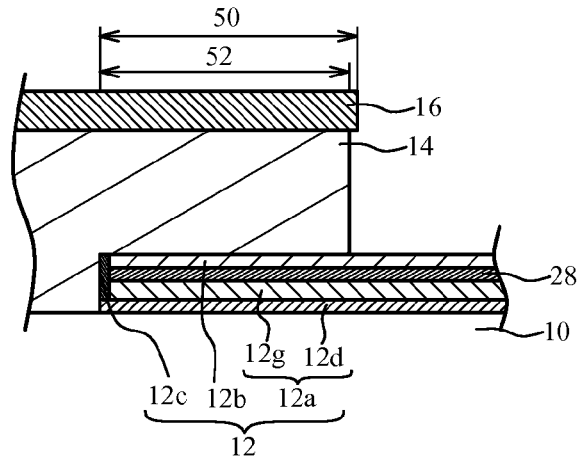

As illustrated in FIG. 9C, the upper electrode 16 is formed on the piezoelectric film 14. The upper electrode 16 is formed by, for example, sputtering, vacuum evaporation, or CVD. The upper electrode 16 is patterned into a desired shape by photolithography and etching. The upper electrode 16 may be formed by liftoff. As illustrated in FIG. 9D, the piezoelectric film 14 is etched by using a photoresist (not illustrated) or the upper electrode as an etching mask. The piezoelectric film 14 may be etched by wet etching or dry etching.

The insulating film 28 may be sandwiched by the lower layer 12a (first conductive film) and the upper layer 12b (second conductive film) of the lower electrode 12 as described in the second embodiment. As described above, it is sufficient if the insulating film 28 is sandwiched by the lower layer and the upper layer of at least one of the lower electrode 12 and the upper electrode 16.

Third Embodiment

Figure 10A:
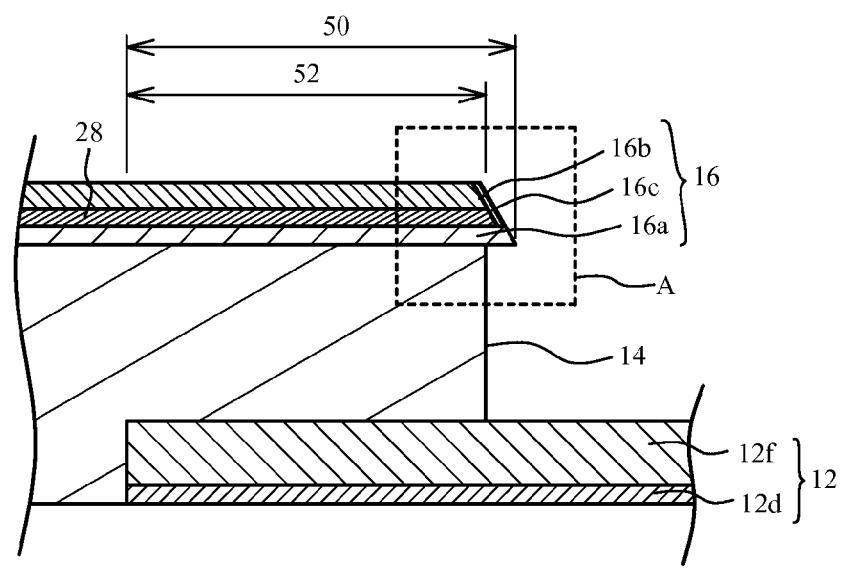
FIG. 10A is a schematic cross-sectional view of a lower electrode and an upper electrode in the resonance region of a third embodiment.
Figure 10B:
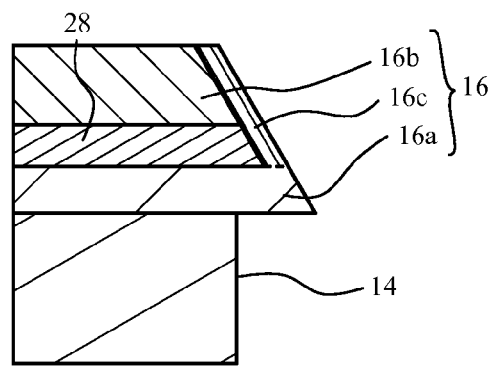
FIG. 10B is an enlarged view of the region A in FIG. 10A.

A third embodiment forms the edge surface of the lower electrode or the upper electrode in a tapered shape. FIG. 10A is a schematic cross-sectional view of a lower electrode and an upper electrode in the resonance region 50 of the third embodiment, and FIG. 10B is an enlarged view of the region A in FIG. 10A. As illustrated in FIG. 10A and FIG. 10B, the edge surfaces of the insulating film 28 and the upper layer 16b of the upper electrode 16 are formed in a tapered shape. Other structures are the same as those of the first embodiment illustrated in FIG. 2A and FIG. 2B, and a description thereof is omitted.

Figure 11A:
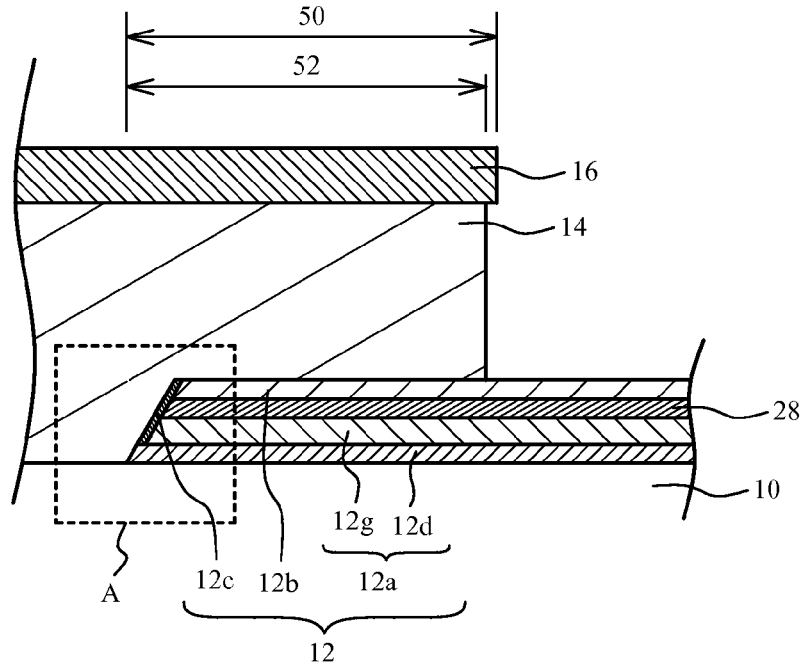
FIG. 11A is a schematic cross-sectional view of a lower electrode and an upper electrode in the resonance region of a variation of the third embodiment.
Figure 11B:
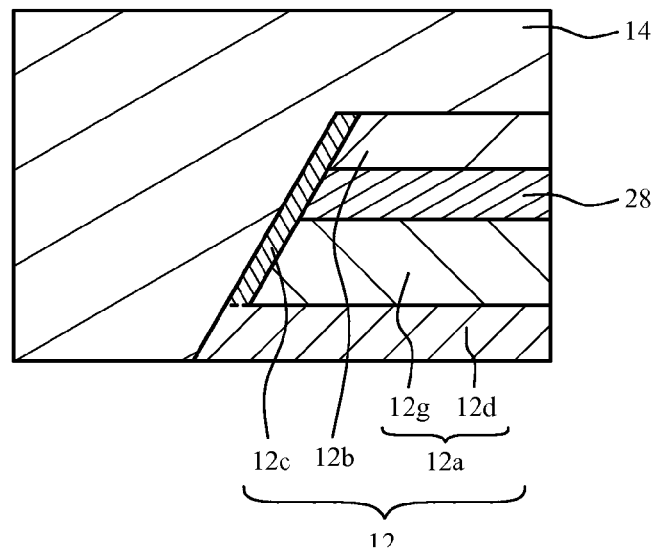
FIG. 11B is an enlarged view of the region A in FIG. 11A.

FIG. 11A is a schematic cross-sectional view of a lower electrode and an upper electrode in the resonance region of a variation of the third embodiment, and FIG. 11B is an enlarged view of the region A in FIG. 11A. As illustrated in FIG. 11A and FIG. 11B, the edge surfaces of the insulating film 28 and the upper layer 12b of the lower electrode 12 are formed in a tapered shaped. Other structures are the same as those of the second embodiment illustrated in FIG. 7A and FIG. 7B, and thus a description thereof is omitted.

As described in the third embodiment and the variation thereof, the edge surface of the insulating film 28 of at least one of the lower electrode 12 and the upper electrode 16 may be formed in a tapered shape so that the area of the upper surface of the insulating film 28 is smaller than that of the lower surface.

Fourth Embodiment

Figure 12A:
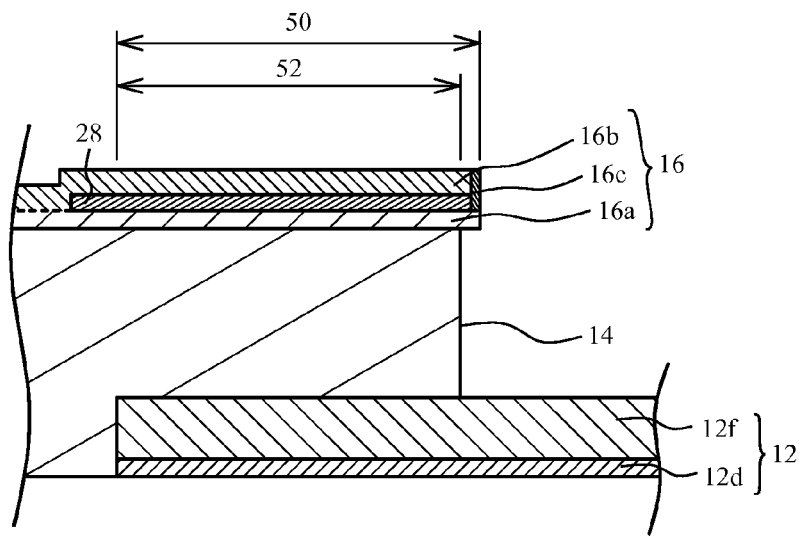
FIG. 12A is a schematic cross-sectional view of a lower electrode and an upper electrode in the resonance region of a fourth embodiment.
Figure 12B:
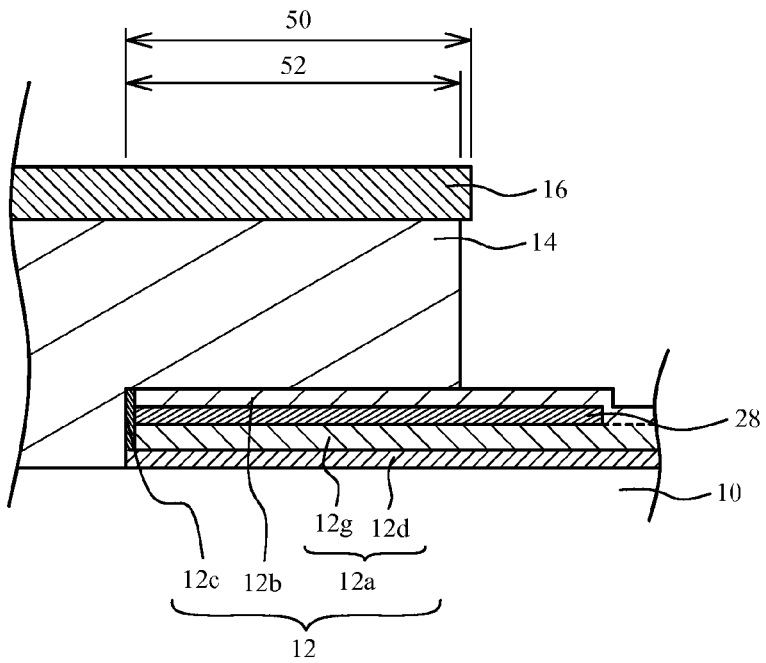
FIG. 12B is a schematic cross-sectional view of the lower electrode and the upper electrode in the resonance region of a variation of the fourth embodiment.

FIG. 12A is a schematic cross-sectional view of a lower electrode and an upper electrode in the resonance region of a fourth embodiment, and FIG. 12B is a schematic cross-sectional view of a lower electrode and an upper electrode in the resonance region of a variation of the fourth embodiment. As illustrated in FIG. 12A, the insulating film 28 is not formed in an extraction region of the upper electrode 16. Other structures are the same as those of the first embodiment illustrated in FIG. 2A, and thus a description thereof is omitted. As described in the fourth embodiment, the insulating film 28 is not formed in at least a part of a region where the upper electrode 16 is formed other than the opposing region 52.

As illustrated in FIG. 12B, the insulating film 28 is not formed in an extraction region of the lower electrode 12. Other structures are the same as those of the second embodiment illustrated in FIG. 7A, and thus a description thereof is omitted. As described in the variation of the fourth embodiment, the insulating film 28 is not formed in at least a part of a region where the lower electrode 12 is formed other than the opposing region 52.

The fourth embodiment and the variation thereof can prevent the insulating film 28 and the piezoelectric film 14 from exfoliating when a bump is formed on the lower electrode 12 or the upper electrode 16 in a region where the insulating film 28 is not formed and flip-chip bonding is performed or a bonding wire is connected to the region. In the fourth embodiment and the variation thereof, the edge surface of the insulating film 28 may be formed in a tapered shape as described in the third embodiment.

Fifth Embodiment

Figure 13A:
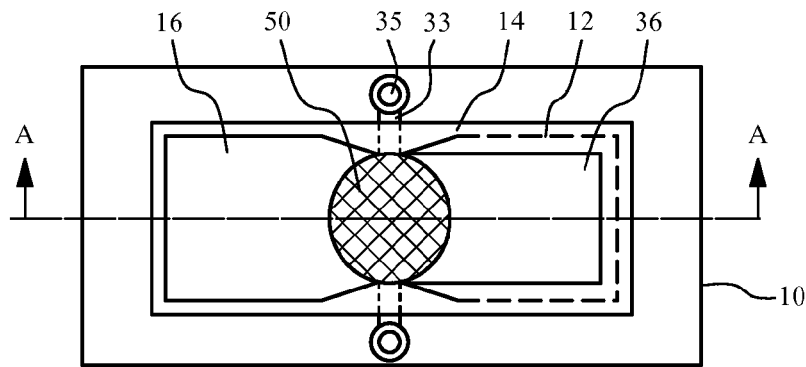
FIG. 13A is a plan view of a piezoelectric thin film resonator in accordance with a fifth embodiment.
Figure 13B:
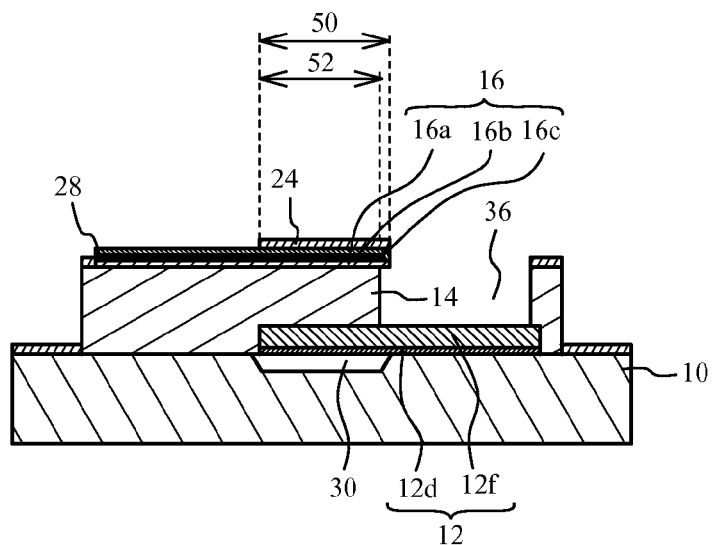
FIG. 13B and FIG. 13C are cross-sectional views taken along line A-A in FIG. 13A.
Figure 13C:
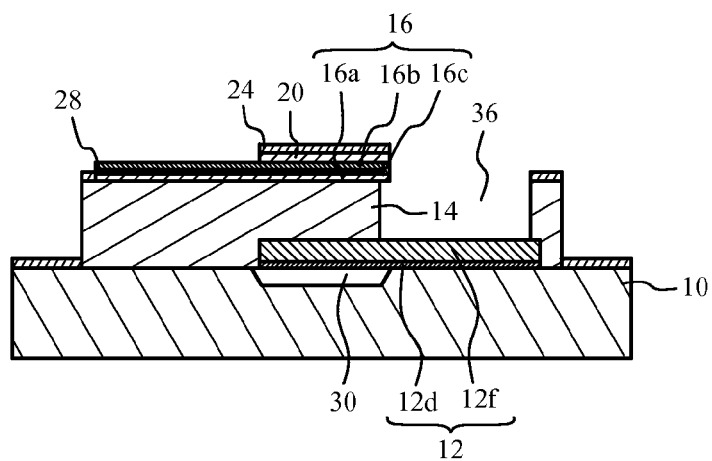

A fifth embodiment changes a structure of the air-space. FIG. 13A is a plan view of a piezoelectric thin film resonator in accordance with the fifth embodiment, and FIG. 13B and FIG. 13C are cross-sectional views taken along line A-A in FIG. 13A. FIG. 13B is a cross-sectional view of a series resonator of, for example, a ladder-type filter, and FIG. 13C is a cross-sectional view of a parallel resonator of, for example, the ladder-type filter. As illustrated in FIG. 13A through FIG. 13C, a recessed portion is formed in the upper surface of the substrate 10. The lower electrode 12 is formed on the substrate 10 so as to be substantially flat. This makes the air-space 30 formed in the recessed portion of the substrate 10. The air-space 30 is formed in the resonance region 50. Other structures are the same as those of the first embodiment, and a description thereof is omitted. The air-space 30 may be formed so as to pierce through the substrate 10. In the fifth embodiment, the insulating film 28 may be located in the lower electrode 12 as described in the second embodiment. The edge surface of the insulating film 28 may be formed in a tapered shape as described in the third embodiment. The insulating film 28 may fail to be formed in at least a part of a region where the upper electrode 16 is formed other than the opposing region 52 as described in the fourth embodiment.

Figure 14A:
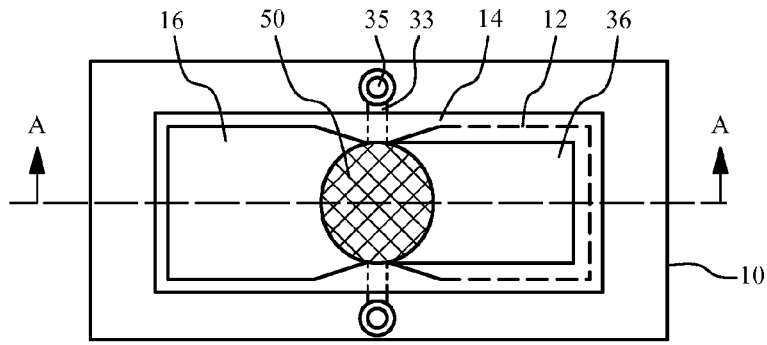
FIG. 14A is a plan view of a piezoelectric thin film resonator in accordance with a variation of the fifth embodiment.
Figure 14B:
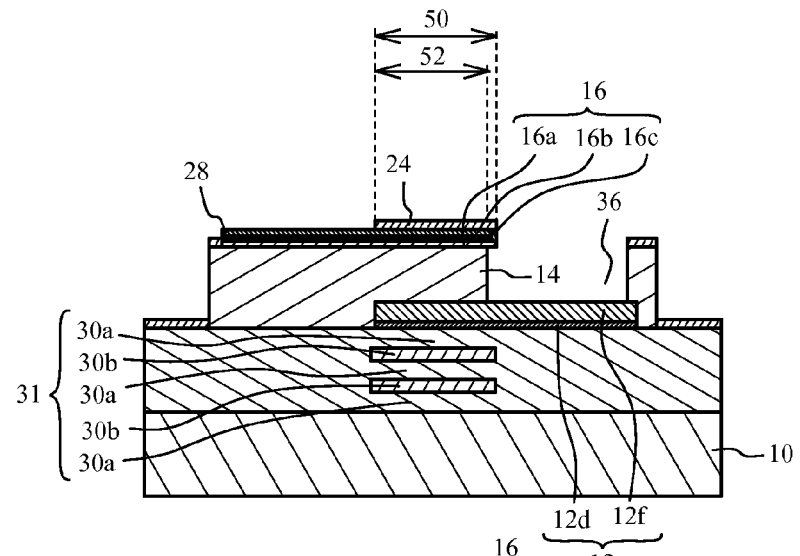
FIG. 14B and FIG. 14C are cross-sectional views taken along line A-A in FIG. 14A.
Figure 14C:
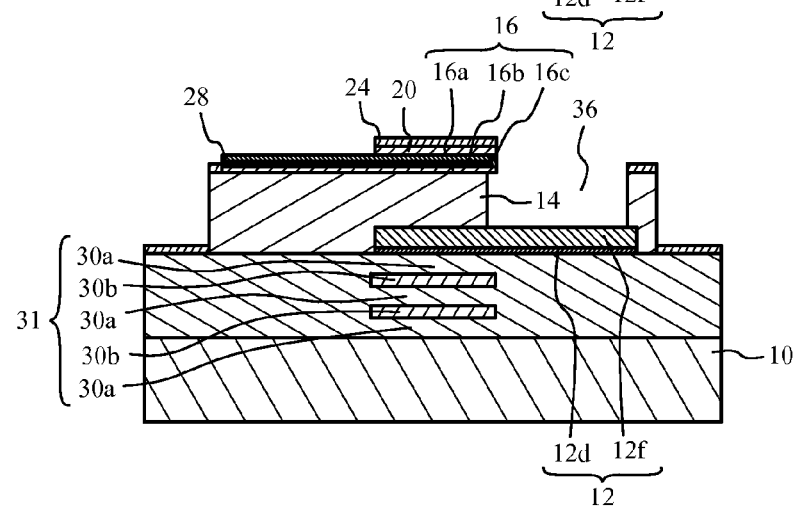

A variation of the fifth embodiment provides an acoustic reflection film instead of the air-space. FIG. 14A is a plan view of a piezoelectric thin film resonator in accordance with the variation of the fifth embodiment, and FIG. 14B and FIG. 14C are cross-sectional views taken along line A-A in FIG. 14A. FIG. 14B is a cross-sectional view of a series resonator of, for example, a ladder-type filter, and FIG. 14C is a cross-sectional view of a parallel resonator of, for example, a ladder-type filter. As illustrated in FIG. 14A through FIG. 14C, an acoustic reflection film 31 is formed under the lower electrode 12 in the resonance region 50. The acoustic reflection film 31 is formed by alternately stacking a film 30a with a low acoustic impedance and a film 30b with a high acoustic impedance. The films 30a and 30b have film thicknesses of approximately λ/4 (λ is the wavelength of the acoustic wave). The number of the films 30a and the films 30b to be stacked can be arbitrary determined. Other structures are the same as those of the first embodiment, and a description thereof is omitted.

As described in the first embodiment through the fifth embodiment, the piezoelectric thin film resonator may be an FBAR (Film Bulk Acoustic Resonator) in which the air-space 30 is formed between the substrate 10 and the lower electrode 12 in the resonance region 50. In addition, as described in the variation of the fifth embodiment, the piezoelectric thin film resonator may be an SMR (Solidly Mounted Resonator) that includes the acoustic reflection film 31, which reflects the acoustic wave propagating through the piezoelectric film 14, under the lower electrode 12 in the resonance region 50. In the variation of the fifth embodiment, the insulating film 28 may be located in the lower electrode 12 as described in the second embodiment. The edge surface of the insulating film 28 may be formed in a tapered shape as described in the third embodiment. The insulating film 28 may fail to be formed in at least a part of a region where the upper electrode 16 is formed other than the opposing region 52 as described in the fourth embodiment.

Sixth Embodiment

Figure 15:
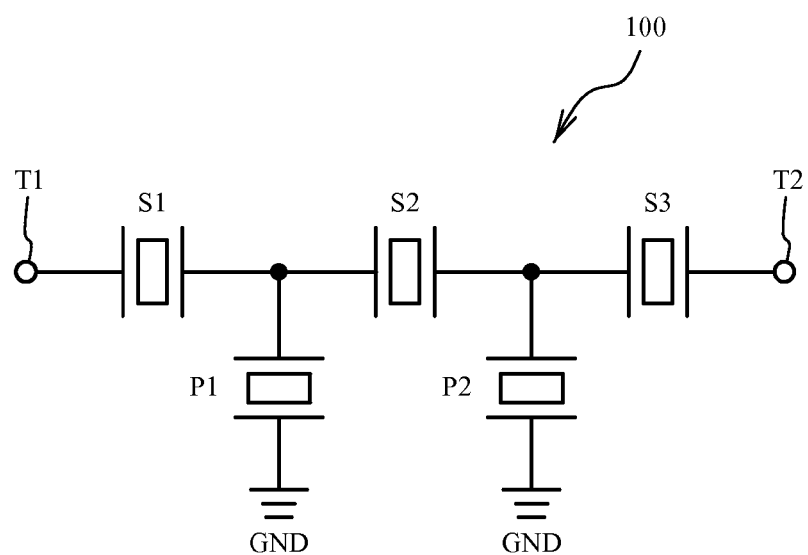
FIG. 15 is a circuit diagram illustrating a ladder-type filter in accordance with a sixth embodiment.

A sixth embodiment uses one of the resonators of the first through fifth embodiments for a filter as an acoustic wave device. FIG. 15 is a circuit diagram illustrating a ladder-type filter in accordance with the sixth embodiment. As illustrated in FIG. 15, the ladder-type filter 100 includes one or more series resonators S1 to S3 and one or more parallel resonators P1 to P2. The series resonators S1 to S3 are connected in series between input-output terminals T1 and T2. The parallel resonators P1 to P2 are connected in parallel between the input-output terminals T1 and T2. At least one of the series resonators S1 to S3 and the parallel resonators P1 to P2 may be the resonator described in the first embodiment through the fifth embodiment.

Although the embodiments of the present invention have been described in detail, it is to be understood that the various change, substitutions, and alterations could be made hereto without departing from the spirit and scope of the invention.

What is claimed is:

1. An acoustic wave device comprising:
 a substrate;
 a piezoelectric film located on the substrate;
 a lower electrode and an upper electrode facing each other across the piezoelectric film, the upper electrode including a first conductive film and a second conductive film formed on the first conductive film;
 an insulating film sandwiched between the first conductive film and the second conductive film and having a temperature coefficient of an elastic constant opposite in sign to a temperature coefficient of an elastic constant of the piezoelectric film; and
 a third conductive film formed on edge surfaces of the insulating film and the second conductive film and causing electrical short circuits between the first conductive film and the second conductive film,
 wherein an outer periphery of the piezoelectric film at an extracting wiring side of the lower electrode is located further in than an edge surface of the insulating film.

2. The acoustic wave device according to claim 1, wherein the insulating film substantially includes, in a plan view, an opposing region where the lower electrode and the upper electrode face each other across the piezoelectric film, and an area of a bottom surface of the insulating film is equal to or greater than that of the opposing region in the plan view.

3. The acoustic wave device according to claim 1, wherein a film thickness of the third conductive film in a normal direction of the edge surface is less than a film thickness of the first conductive film in a normal direction of the substrate.

4. The acoustic wave device according to claim 1, wherein a film thickness of the at least one of the lower electrode and the upper electrode in a resonance region where the lower electrode and the upper electrode face each other is constant within the resonance region.

5. The acoustic wave device according to claim 1, wherein the third conductive film includes a material of the first conductive film.

6. The acoustic wave device according to claim 1, wherein the edge surface of the insulating film is formed in a tapered shape so that an area of an upper surface of the insulating film is less than an area of a lower surface of the insulating film.

7. The acoustic wave device according to claim 1, wherein the insulating film is primarily composed of silicon oxide or silicon nitride.

8. The acoustic wave device according to claim 1, wherein the piezoelectric film is primarily composed of aluminum nitride.

9. The acoustic wave device according to claim 1, wherein an air-space is formed between the substrate and the lower electrode in a resonance region where the lower electrode and the upper electrode face each other.

10. The acoustic wave device according to claim 1, further comprising:
an acoustic reflection film, under the lower electrode, that reflects an acoustic wave propagating through the piezoelectric film in a resonance region where the lower electrode and the upper electrode face each other.

* * * * *